(12) United States Patent
Lee

(10) Patent No.: US 11,689,242 B2
(45) Date of Patent: *Jun. 27, 2023

(54) ELECTRONIC DEVICE INCLUDING WIRELESS COMMUNICATION SYSTEM, FOR PROCESSING TRANSMISSION SIGNAL OR RECEPTION SIGNAL

(71) Applicant: Samsung Electronics Co., Ltd., Gyeonggi-do (KR)

(72) Inventor: Young Min Lee, Seoul (KR)

(73) Assignee: Samsung Electronics Co. Ltd

( * ) Notice: Subject to any disclaimer, the term of this patent is extended or adjusted under 35 U.S.C. 154(b) by 0 days.

This patent is subject to a terminal disclaimer.

(21) Appl. No.: 17/574,999

(22) Filed: Jan. 13, 2022

(65) Prior Publication Data

US 2022/0140857 A1 May 5, 2022

Related U.S. Application Data

(63) Continuation of application No. 16/642,710, filed as application No. PCT/KR2018/010341 on Sep. 5, 2018, now Pat. No. 11,228,336.

(30) Foreign Application Priority Data

Sep. 5, 2017 (KR) .................. 10-2017-0113381

(51) Int. Cl.
*H04B 1/40* (2015.01)
*H04B 1/48* (2006.01)
(Continued)

(52) U.S. Cl.
CPC .................. *H04B 1/48* (2013.01); *H03F 3/20* (2013.01); *H03F 3/68* (2013.01); *H03F 2200/294* (2013.01); *H03F 2200/451* (2013.01)

(58) Field of Classification Search
CPC ........ H04B 1/44; H04B 7/0417; H04B 17/14; H04B 1/04; H04B 1/38; H04B 1/40;
(Continued)

(56) References Cited

U.S. PATENT DOCUMENTS 5,644,316 A 7/1997 Lewis et al.
7,898,390 B2 * 3/2011 Greeff .................. G01S 13/751
340/505

(Continued)

FOREIGN PATENT DOCUMENTS

EP 2 197 119 6/2010
KR 101045760 7/2011
(Continued)

OTHER PUBLICATIONS

PCT/ISA/210 Search Report issued on PCT/KR2018/010341, pp. 5.
(Continued)

*Primary Examiner* — Nhan T Le
(74) *Attorney, Agent, or Firm* — The Farrell Law Firm, P.C.

(57) ABSTRACT

An electronic device is provided. The electronic device may include a plurality of antennas configured to transmit and receive a signal in a radio frequency (RF) frequency band; and an RF circuit configured to process the signal in the RF frequency band. The RF circuit includes a reception (Rx) path configured to transfer a first signal received through the plurality of antennas, a transmission (Tx) path configured to transfer a second signal to the plurality of antennas, and a coupler configured to transfer at least a part of the second signal obtained in the Tx path to the Rx path. The Tx path includes a power divider configured to distribute power to at least one antenna among the plurality of antennas, and the coupler is electrically connected to an input terminal of the power divider to be disposed before the power divider.

14 Claims, 13 Drawing Sheets

(51) Int. Cl.
*H03F 3/20* (2006.01)
*H03F 3/68* (2006.01)

(58) Field of Classification Search
CPC ............... H04B 1/48; H03F 2200/198; H03F 2200/451; H03F 2200/294; H03F 3/20; H03F 3/24; H03F 3/68
See application file for complete search history.

(56) References Cited

U.S. PATENT DOCUMENTS

| | | | |
|---|---|---|---|
| 8,233,520 | B2 | 7/2012 | Wong |
| 8,618,983 | B2 | 12/2013 | Chen et al. |
| 8,964,821 | B2 | 2/2015 | Coan et al. |
| 9,048,933 | B2 | 6/2015 | Kwon et al. |
| 9,178,559 | B2 | 11/2015 | All et al. |
| 9,197,271 | B2 | 11/2015 | Peter |
| 9,258,027 | B2 | 2/2016 | Peter |
| 9,490,886 | B2 | 11/2016 | Lin |
| 10,135,478 | B2 * | 11/2018 | Chi .................. H04B 1/38 |
| 11,191,126 | B2 * | 11/2021 | Nguyen ............ H01Q 1/246 |
| 11,228,336 | B2 * | 1/2022 | Lee .................. H03F 3/20 |
| 2003/0027530 | A1 | 2/2003 | Levitt |
| 2006/0035601 | A1 | 2/2006 | Seo |
| 2007/0190952 | A1 | 8/2007 | Waheed |
| 2009/0285270 | A1 | 11/2009 | Wong |
| 2013/0210477 | A1 | 8/2013 | Peter |
| 2014/0132450 | A1 | 5/2014 | Chen et al. |
| 2014/0273814 | A1 | 9/2014 | Ralph |
| 2015/0118980 | A1 | 4/2015 | Leung et al. |
| 2015/0280946 | A1 | 10/2015 | Sabouri et al. |
| 2017/0164337 | A1 | 6/2017 | Ryoo et al. |
| 2018/0331712 | A1 | 11/2018 | O'Brien |

FOREIGN PATENT DOCUMENTS

| | | |
|---|---|---|
| KR | 101214589 | 12/2012 |
| KR | 101252727 | 4/2013 |
| KR | 1020130074581 | 7/2013 |
| KR | 1020140136956 | 12/2014 |
| WO | WO 2013/056257 | 4/2013 |

OTHER PUBLICATIONS

PCT/ISA/237 Written Opinion issued on PCT/KR2018/010341, pp. 7.
Linear Technology Datasheet: "LT5500 1.8GHz to 2.7GHz Receiver Front End", XP55704670, Dec. 31, 2005, 12 pages.
European Search Report dated Jun. 29, 2020 issued in counterpart application No. 18854425.8-1203, 8 pages.
Korean Office Action dated Jun. 21, 2021 issued in counterpart application No. 10-2017-0113381, 10 pages.
European Search Report dated Nov. 17, 2021 issued in counterpart application No. 18854425.8-1203, 6 pages.

* cited by examiner

ELECTRONIC DEVICE INCLUDING WIRELESS COMMUNICATION SYSTEM, FOR PROCESSING TRANSMISSION SIGNAL OR RECEPTION SIGNAL

PRIORITY

This application is a Continuation Application of U.S. patent application Ser. No. 16/642,710, which was filed in the U.S. Patent and Trademark Office on Feb. 27, 2020, which is a National Phase Entry of PCT International Application No. PCT/KR2018/010341, which was filed on Sep. 5, 2018, and claims priority to Korean Patent Application No. 10-2017-0113381, which was filed on Sep. 5, 2017, the entire content of each of which is incorporated herein by reference.

BACKGROUND

1. Field

Embodiments disclosed herein relate to a technique for processing a transmit (Tx) signal or a receive (Rx) signal in a wireless communication system.

2. Description of Related Art

Wireless communication systems have evolved to support higher data rates to meet increasing traffic demands for wireless data. Recently, research is being conducted on 5G (fifth generation) communication technology which is the next generation communication technology of 4G (fourth generation) communication technology. The 5G communication technology aims to achieve accommodation of 1000 times of explosive data traffic compared to long term evolution (LTE) that is a kind of 4G communication technology, a dramatic increase in data rate per user with an average data rate of 1 Gbps, a large increase in the number of connected electronic devices, low end-to-end latency and high energy efficiency, as technical goals. In the 5G network, it is possible to transmit and receive frequencies in the higher mmWave band than that of the 4G networks. For example, in the 5G network, it is possible to transmit and receive a signal having a high frequency, such as 28 GHz, in a wide frequency band.

As such, a new structured communication circuit may be required for efficient communication to transmit and receive signals using high frequencies in a wide band. For example, a design of an RF circuit having a structure different from that of a conventional radio frequency (RF) circuit for 3G and 4G network communication may be required.

The filter of the conventional RF circuit is designed to be suitable for a signal of a relatively low and narrow band frequency, for example, signals of frequencies of a band of 1 to 2 GHz, and therefore, is not suitable to be applied to the RF circuit for transmitting and receiving a high frequency wideband signal.

Conventional wireless communication circuits, such as RF circuits for transmitting and receiving signals over the 5G network, may be designed not to include couplers, making power control and calibration difficult.

SUMMARY

Various embodiments disclosed in the disclosure provide an electronic device for efficiently transmitting or receiving a high frequency wideband signal.

According to the embodiments disclosed herein, the electronic device may effectively transmit or receive a high frequency wideband signal.

According to the embodiments disclosed herein, the electronic device may effectively suppress an image signal.

According to the embodiments disclosed herein, the electronic device may effectively control and calibrate the power of an RF signal.

According to an embodiment disclosed herein, an electronic device may include an radio frequency (RF) circuit that process a signal in an radio frequency (RF) frequency band, and the RF circuit may include a Rx path for transferring a first signal received through the antenna, a Tx path for transferring a second signal output from an amplifier to the antenna, and a coupler for transferring at least a part of the second signal obtained in the Tx path to the Rx path.

Furthermore, according to an embodiment disclosed herein, an RF circuit may include a Rx path including a low noise amplifier and a down converter that converts a Rx signal into an intermediate frequency (IF) signal based on the Rx signal and a first local oscillator (LO) signal, a Tx path including an up converter that converts a Tx signal into a signal in an mmWave band based on a second oscillator (LO) signal and the Tx signal, and a coupling path for transferring at least a part of the Tx signal to the Rx path.

Furthermore, according to an embodiment disclosed herein, an electronic device may include an RF circuit that processes a signal in the RF frequency band, wherein the RF circuit may include a Rx path including a low noise amplifier and a down converter that converts a Rx signal into an intermediate frequency (IF) signal based on the Rx signal and a first local oscillator (LO) signal, a Tx path including an up converter that converts a Tx signal into a signal in an mmWave band based on a second oscillator (LO) signal and the Tx signal, and a coupling path for transferring at least a part of the Tx signal to the Rx path.

In addition, various effects may be provided that are directly or indirectly understood through the disclosure.

BRIEF DESCRIPTION OF THE DRAWINGS

The above and other aspects, features, and advantages of certain embodiments of the disclosure will be more apparent from the following detailed description taken in conjunction with the accompanying drawings, in which.

In the description of the drawings, the same or similar reference numerals may be used for the same or similar components.

DETAILED DESCRIPTION

Figure 1:
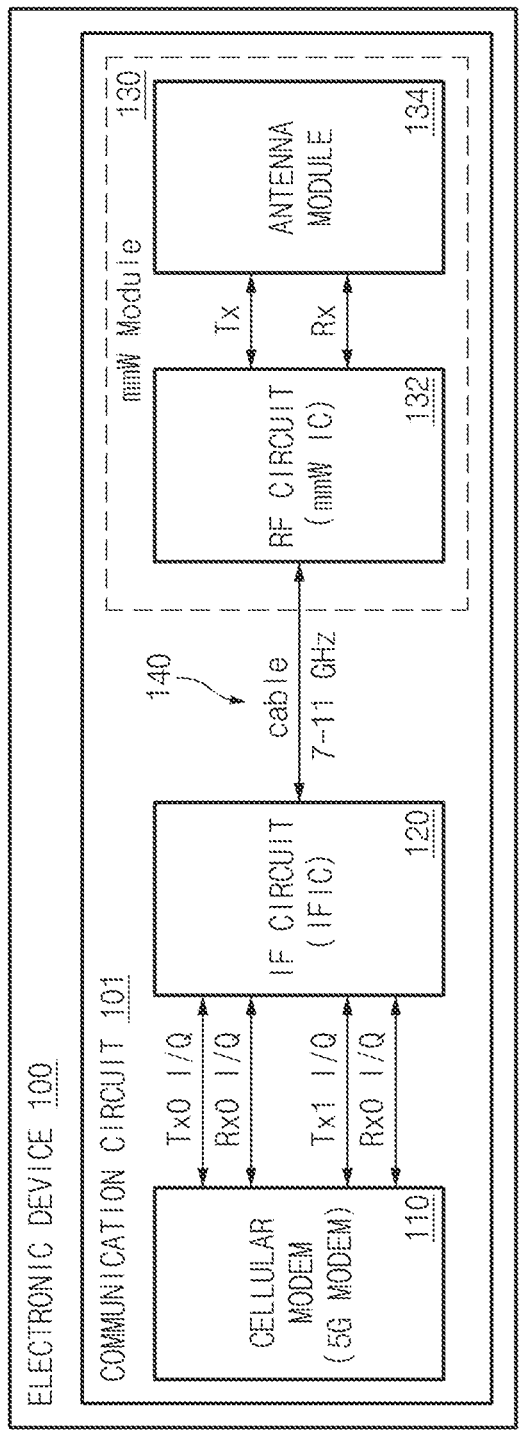
FIG. 1 is a block diagram of a configuration of an electronic device according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

FIG. 1 is a block diagram of a configuration of an electronic device according to an embodiment.

According to an embodiment of the disclosure, an electronic device 100 may include a communication circuit 101 capable of transmitting or receiving a signal to or from an external device through a wireless network.

According to an embodiment, the communication circuit 101 may transmit and receive a high frequency wideband signal. For example, the communication circuit 101 may transmit and receive a signal having a higher frequency than that of the 4G network. The communication circuit 101 may transmit and receive a signal in an mmWave band, for example, a 5G signal. The 5G signal may be, for example, a signal in a 28 GHz band.

According to an embodiment, the communication circuit 101 may include a cellular modem 110, an IF circuit 120, and an RF module 130. In addition, the structure of the communication circuit 101 may be variously modified according to various embodiments described herein.

According to an embodiment, the cellular modem 110 may support signals in the mmWave band. For example, the cellular modem 110 may support next generation communications including 5G communication. The cellular modem 110 may be referred to as a 5G modem. The cellular modem 110 may include a communication processor (CP).

According to an embodiment, the IF circuit 120 may transmit a signal received through an antenna or an antenna module 134 (hereinafter, referred to as an antenna module) to the cellular modem 110 or transmit a signal obtained from the cellular modem 110 to the antenna module. For example, the IF circuit 120 may be disposed between the cellular modem 110 and the RF module 130. The IF circuit 120 may process an IF signal. The IF circuit 120 may be referred to as an IF integrated circuit (IFIC). The IF signal may be, for example, a signal in a 7-11 GHz band.

According to an embodiment, the IF circuit 120 may transmit or receive a signal to and from the RF module 130 through a cable 140. The cable 140 may be, for example, a coaxial cable or an RF flexible printed circuit board (FPCB).

According to an embodiment, the RF module 130 may include an RF circuit 132 and/or the antenna module 134. The RF module 130 may be, for example, an integrated chip including the RF circuit 132 and the antenna module 134. The RF module 130 may process RF signals and transmit or receive signals in the RF band to or from an external device (e.g., a base station). For example, the RF module 130 may transmit or receive a signal in the mmWave band to or from an external device.

According to an embodiment, the RF circuit 132 may convert a signal between the RF band and the IF band. The RF circuit 132 may convert an IF signal obtained through the IF circuit 120 into an RF signal, or convert an RF signal obtained through the antenna module 134 into an IF signal. According to an embodiment, the RF signal may be a signal in the mmWave band. The RF circuit 132 may be referred to as an mmWave integrated circuit (mmWIC), an RF front end (RFFE), or the like.

According to an embodiment, the antenna module 134 may transmit or receive a high frequency wideband signal. The antenna module 134 may be an array antenna. For example, the antenna module 134 may be a 5G antenna.

As shown in FIG. 1, the communication circuit 101 may support a heterodyne scheme. Under a heterodyne system, an image signal may be generated, and suppression of the image signal may be important to improve system performance.

According to an embodiment, an image signal may be generated when a receive (Rx) signal is analyzed. The image signal may be generated by, for example, the 2nd harmonic of a local oscillator (LO) signal and the RF signal. Interference between signals may occur in the communication circuit 101, and degradation of sensitivity, transmission performance, and the like may be caused. The image signal may be located close to the frequency of the intermediate frequency (IF) signal and may have a great influence, so the characteristics of the image signal may be important. For example, the image signal may affect the error vector magnitude (EVM), sensitivity performance, and the like of a signal.

Therefore, it is possible to effectively improve the performance of the communication circuit 101 in the case of suppressing the image signal generated by the RF signal of RF and EVM and the 2nd harmonic of the LO signal. An RF front end (RFFE) supporting transmission and reception of high frequency wideband signals, for example, 5G signals, may include a filter capable of suppressing an image signal therein. Depending on the performance of the filter, image signal suppression, low loss characteristics of the RF and IF signals may vary.

Conventional filters of 1 to 2 GHz have a loss of about 1.5 decibels (dB) and attenuation performance of 50 dB or more due to the development of design techniques such as bulk acoustic wave (BAW). In the band above 3 GHz, because the filter is implemented by LC, it may be difficult to secure high attenuation and low loss. A conventional filter structure needs to attenuate various frequency bands at the same time while being applied to a high band (e.g., 11 GHz), and therefore, there may be a lot of loss, and there may be a limit to be applied to the wideband frequency.

The mmWave frequency band may vary depending on use entities. For example, Europe may use a frequency band of 24 GHz to 27 GHz, Japan may use a frequency band of 24 GHz to 31 GHz, and Korea may use a frequency band of 26 GHz to 29 GHz. According to one embodiment, it may be difficult to simultaneously handle various bands when a conventional filter is used. For example, in a system using 24 GHz for RF, 17 GHz for LO, and 7 GHz for IF, the image signal may be of 10 GHz. In a system using 26 GHz for RF, 17 GHz for LO, and 9 GHz for IF, the image signal may be a signal of 8 GHz. According to various embodiments disclosed herein, the electronic device may process various high frequency wideband signals.

Figure 2:
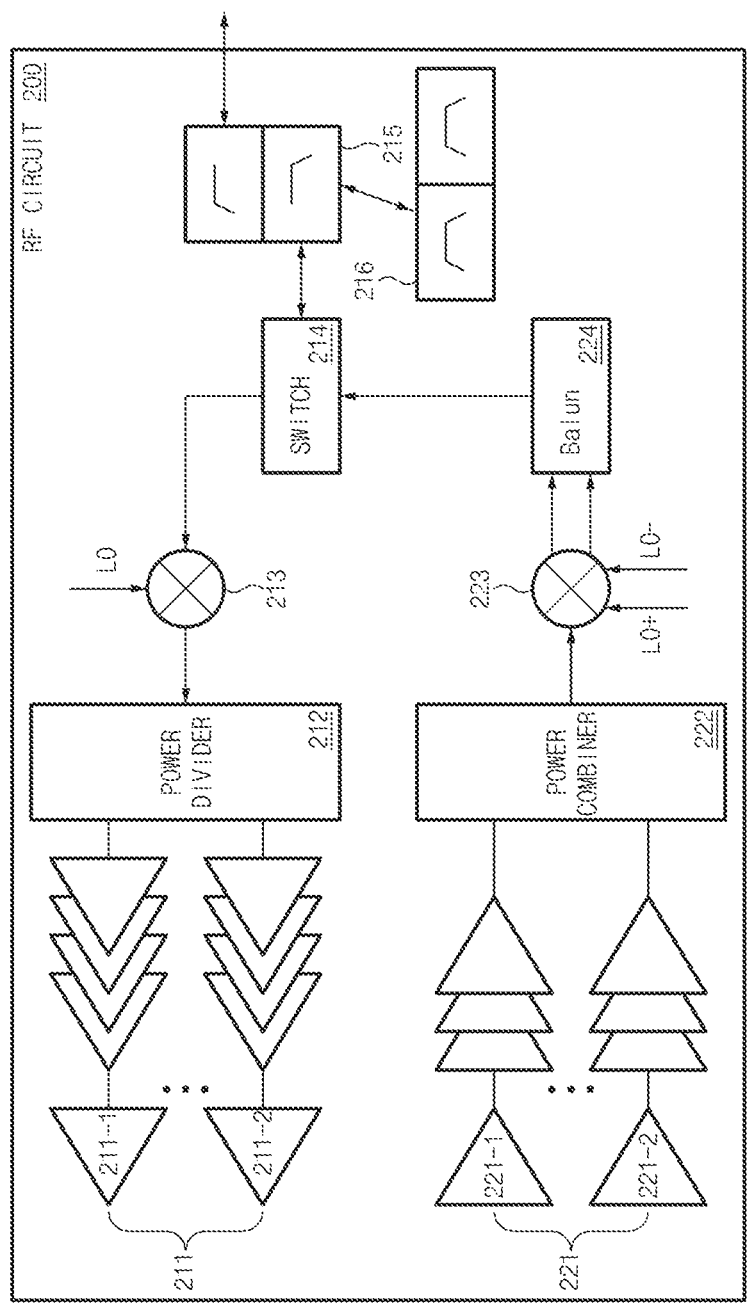
FIG. 2 is a structural diagram of an RF circuit according to an embodiment.

FIG. 2 is a structural diagram of an RF circuit according to an embodiment.

According to an embodiment, an RF circuit 200 (e.g., the RF circuit 132 of FIG. 1) may input LO+ and LO− signals to a mixer 223 and include a balance to unbalance transformer (balun) 224 that processes an output image signal to reduce the influence of the image signal. For example, the RF circuit 200 may include power amplifiers 211 and 221, a power divider 212, a power combiner 222, mixers 213 and 223, and the balun 224. In addition, the configuration of the RF circuit 200 may be variously modified. For example, the RF circuit 200 may include a switch 214.

According to an embodiment, the configurations of the RF circuit 200 may constitute an Rx path or a Tx path. The Rx path may be a path through which an Rx signal is transmitted. The Rx path may transfer the Rx signal obtained through an antenna module (e.g., the antenna module 134 of FIG. 1) to the IF circuit 120. The Rx path may convert the RF signal into an IF signal. The signal obtained through the antenna module may be a signal in an RF band. According to an embodiment, the signal obtained through the antenna module may be a signal in an mmWave band.

According to an embodiment, the Tx path may be a path through which a Tx signal is transmitted. For example, the Tx path may transmit a signal obtained through an IF circuit to the antenna module. The Tx path may convert an IF signal into an RF signal.

According to an embodiment, the Rx path may include a low noise amplifier(s) (LNA) 221, the power combiner 222, the mixer 223, and the balun 224. In addition, the configuration of the Rx path may be variously modified.

According to an embodiment, the low noise amplifier(s) 221 may amplify a signal obtained from the antenna module. The low noise amplifier(s) 221 may be located close to the antenna module to reduce signal attenuation in lines. According to an embodiment, the low noise amplifier(s) 221 may be disposed between the power combiner 222 and the antenna module. The low noise amplifier(s) 221 may be disposed for each antenna module. For example, the antenna module may be configured with array antennas. The signals respectively obtained by the array antennas may be input to different low noise amplifiers 221-1 and 221-2.

According to an embodiment, the power combiner 222 may output a plurality of input signals through a single output terminal. According to an embodiment, the Rx signals output from the low noise amplifier(s) 221 may be combined in the power combiner 222. The power combiner 222 may be referred to as a power combiner.

According to an embodiment, the mixer 223 may convert an Rx signal from a signal in an RF band to an IF signal. The mixer 223 may down-convert a frequency of the Rx signal and may be referred to as a down converter. According to one embodiment, the mixer 223 may be disposed between the power combiner 222 and the balun 224. The Rx signal may be, for example, a signal combined at the power combiner 222.

According to an embodiment, the mixer 223 may combine an LO signal and an RF signal to generate an IF signal. In this case, an image signal may be generated. According to an embodiment, the mixer 223 may receive the LO+ and LO− signals to suppress the image signal. In the mixer 223, signals including IF+ and IF− signals may be generated.

According to one embodiment, the balun 224 may be a device that performs conversion between a balanced signal and an unbalanced signal. The balun 224 may be a passive element. According to an embodiment, the balun 224 may process signals output from the mixer 223. In the balun 224, the output signals of the mixer 223 may be synthesized, and the image signal may be suppressed.

Assuming that an Rx signal according to an embodiment is expressed as in Equation 1, the signals output by the mixer 223 may be expressed as in Equation 2. Using the balun 224, the image signal of the Rx signal may be suppressed as in Equations 1 and 3 below.

$$RF = a0*\sin(w1*t) + a1*\sin(2w1*t) + \ldots \quad [\text{Equation 1}]$$

$$LO+ = a0*\sin(w2*t) + a1*\sin(2w2*t) + \ldots ,$$

$$LO- = \sin(w2*t) + a1*\sin(2w2*t) + \ldots ,$$

$$IF+ = b0*\sin((w1-w2)*t) + b1*\sin((2w2-w1)*t) + \ldots ,$$

$$IF- = -b0*\sin((w1-w2)*t) + b1*\sin((2w2-w1)*t) + \ldots , \quad [\text{Equation 2}]$$

$$IF+ + IF- = c0*\sin((w1 w2)*t) + \ldots \quad [\text{Equation 3}]$$

According to an embodiment, an LO signal may be generated in a variety ways. For example, the LO signal may be generated using a phase locked loop (PLL) or may be generated using a phase shifter (PS). In this case, it is possible to effectively suppress an image signal by using a phase shifting technique for phase dis-matching due to wafer variation in the mmWave band.

According to one embodiment, the Tx path may include the mixer 213, the power divider 212, and the power amplifier(s) 211.

According to one embodiment, the mixer 213 may up-convert a frequency band. The mixer 213 may convert a Tx signal from an IF signal to an RF signal. The mixer 213 may be referred to as an up converter. According to one embodiment, a Tx signal and an LO signal are input to the mixer 213, and the Tx signal may be converted into an RF signal.

According to one embodiment, the power divider 212 may distribute Tx power to a plurality of antennas or antenna elements at a constant ratio. According to one embodiment, the power divider 212 may distribute the Tx power of the Tx signal output from the mixer 213 to the plurality of antennas. According to one embodiment, the plurality of antennas or antenna elements may constitute an antenna module (e.g., the antenna module 134 of FIG. 1).

According to one embodiment, the power amplifier(s) 211 may amplify the Tx power. The power amplifier(s) 211 may amplify the power distributed by the power divider 212. The power amplifier(s) 211 may amplify power for a connected antenna among the plurality of antennas. The power amplifier(s) 211 may be electrically connected to a plurality of antennas constituting an antenna array. For example, some amplifier(s) 211-1 of the power amplifier(s) 211 may be connected to a specific antenna among antennas constituting the antenna array, and some other amplifier(s) 211-2 may be electrically connected to an antenna different from the specific antenna. According to one embodiment, the power amplifier(s) 211 may be disposed between the antenna and the power divider 212.

According to one embodiment, the RF circuit 200 may support signal transmission/reception of a time division duplex (TDD) scheme. The RF circuit 200 may include the switch 214.

According to one embodiment, the switch 214 may select a Tx path or a Rx path. The switch 214 may be, for example, a single pole double throw (SPDT). The switch 214 may include a first terminal connected to a Tx path, a second terminal connected to a Rx path, and a third terminal for transmitting a signal to the first terminal or receiving a signal from the second terminal. According to one embodiment, the first terminal may be electrically connected to the mixer 213. The second terminal may be electrically connected to the balun 224.

According to one embodiment, the switch 214 may be controlled by a processor. The processor may be a CP or an application processor (AP). When the switch 214 is connected to the Rx path, the output signal of the balun 224 may be transmitted in the direction of the IF circuit. When the switch 214 is connected to the Tx path, the IF signal output from the IF circuit may be transmitted in the direction of the mixer 213.

According to one embodiment, the switch 214 may operate in a time division duplex (TDD) scheme. The switch 214 may be connected to the Tx path or the Rx path over time. According to one embodiment, the processor may allow the switch 214 to connect the Tx path or the Rx path over time.

Although the switch 214 is illustrated for selection of a path in FIG. 2 and the following embodiments, the switch 214 may be a selection circuit that provides a selection. For example, the selection circuit may be a switch or a divider.

According to one embodiment, a signal may be input/output to/from the RF circuit 200 through one external port. For example, a Tx/Rx signal (e.g., IF signal), a signal for frequency comparison (hereinafter referred to as a VCO signal) of a voltage controlled oscillator (VCO) and a control signal may be input and output through the one port. According to one embodiment, a combination of a diplexer and a duplexer or a triplexer may be applied to an input terminal of a Tx signal in the RF circuit 200. In such a structure, signals may be input and output to and from the RF circuit 200 through one port.

FIG. 2 illustrates a case where a combination of a diplexer 215 and a duplexer 216 is applied to the input terminal of the RF circuit 200. For example, when a Tx/Rx signal, a VCO signal, and a control signal are input through one port of the RF circuit 200, the diplexer 215 may split the signals to different paths according to frequencies. For example, the diplexer 215 may band-separate signals of different frequencies, such as a high band and a low band. According to one embodiment, the diplexer 215 may split the input signals into a first path and a second path according to frequencies. The first path may be used to transmit the Tx signal (or IF signal), the second path may be used to transmit the VCO signal and the control signal.

According to one embodiment, the duplexer 216 may separate the VCO and the control signal.

According to one embodiment, the diplexer 215 may transmit a Tx signal to the switch 214 or may obtain an Rx signal output from the switch 214. According to one embodiment, the diplexer 215 may be electrically connected to the switch 214. The diplexer 215 may be electrically connected to a third terminal of the switch 214.

Using the combination of the duplexer 216 and the diplexer 215 according to the embodiment, the attenuation characteristics may be considered relatively less, which may have a gain in terms of loss when viewed based on a path which the Tx signal passes through. For example, the loss gain may increase in a signal of a band of 6 to 11 GHz.

Using the VCO signal according to one embodiment, a component, such as an external crystal oscillator (XO), may be used in common for each RF module (e.g., the mmWave module 130). In this case, it is possible to secure frequency accuracy and unity for each module when simultaneously operating for each module such that only one XO may be used.

According to one embodiment, the control signal may be a signal for controlling the RF circuit 200 which is received from a processor (e.g., an AP or a CP). For example, the control signal may control the switch 214.

Figure 3:
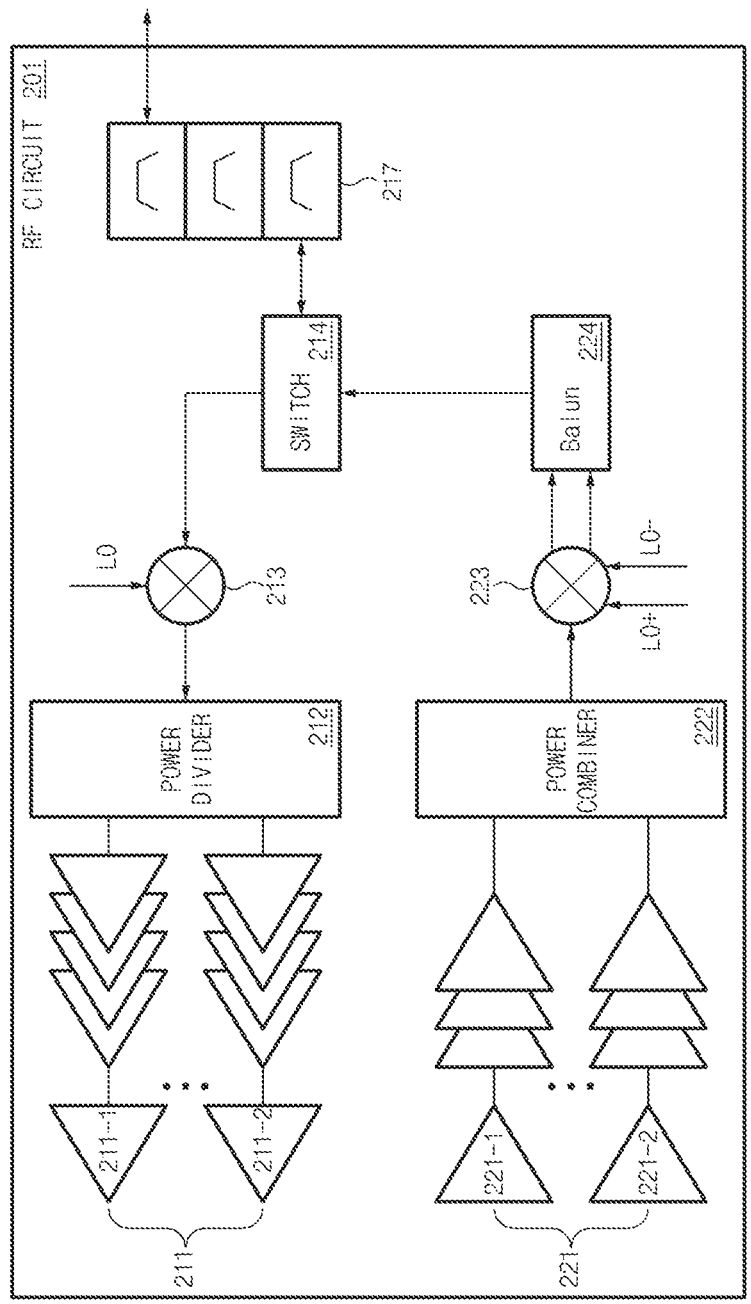
FIG. 3 is a structural diagram of an RF circuit according to an embodiment.

FIG. 3 is a structural diagram of an RF circuit according to an embodiment.

Referring to FIG. 3, an RF circuit 201 (e.g., the RF circuit 132 of FIG. 1) may include a triplexer 217 at an input terminal. Some configurations of the RF circuit 201 may be the same as or similar to the RF circuit 200. For example, the amplifier(s) 211 and 221 the power divider 212, the power combiner 222, the mixer 213, the mixer 223, the switch 214, and the balun 224 may be respectively the same as or similar to the configurations of FIG. 2.

According to one embodiment, the RF circuit 201 may obtain or transmit various signals to an external device through one external port using the triplexer 217. For example, the triplexer 217 may transmit a VCO signal, a control signal, and a Tx/Rx signal. For example, the triplexer 217 may transmit an Rx signal to an IF circuit (e.g., the IF circuit 120 of FIG. 1) through one port. The triplexer 217 may be electrically connected to the switch 214.

Figure 4:
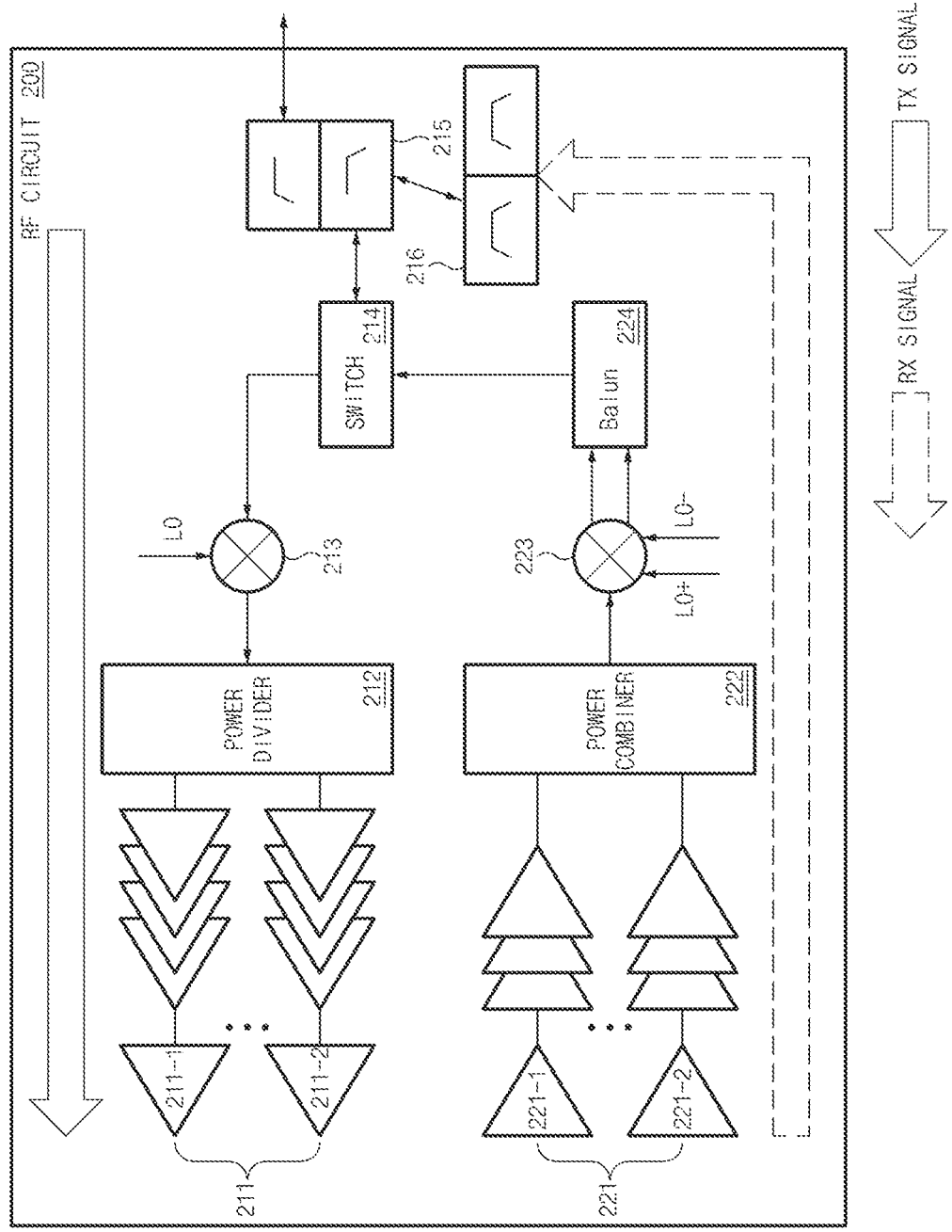
FIG. 4 is a diagram for describing an operation of the RF circuit of FIG. 2 according to an embodiment.

FIG. 4 is a diagram for describing an operation of the RF circuit of FIG. 2 according to an embodiment.

Although the operation of the RF circuit 200 of FIG. 2 is illustrated in FIG. 4, the following embodiments may be applied to the RF circuit 201 of FIG. 3.

According to one embodiment, when the switch 214 is connected to a Tx path, a Tx signal output through the diplexer 215 may be transferred to the Tx path. The Tx signal may be transferred to an antenna module (e.g., the antenna module 134 of FIG. 1) through the mixer 213, the power divider 212, and the power amplifiers 211.

According to one embodiment, when the switch 214 is connected to a Rx path, an Rx signal obtained through the antenna module may be transferred to the diplexer 215 through the switch 214. The Rx signal obtained by the diplexer 215 may be transferred to an IF circuit (e.g., the IF circuit 120 of FIG. 1) through a cable (e.g., the cable 140 of FIG. 1).

According to one embodiment, the Rx signal may be amplified by the LNA(s) 221, combined by the power combiner 222 and input to the mixer 223. Image signals generated in the mixer 223 may be suppressed by the balm 224, and the Rx signal may be transferred to the first terminal of the switch 214.

A conventional RF circuit for transmitting and receiving signals in the mmWave band does not have a feedback receiver (FBRX), thus having a problem that the calibration (calibration) and power control of the Tx signal is difficult. Hereinafter, an RF circuit having an FBRX and transmitting and receiving a signal in the mmWave band is proposed.

Figure 5:
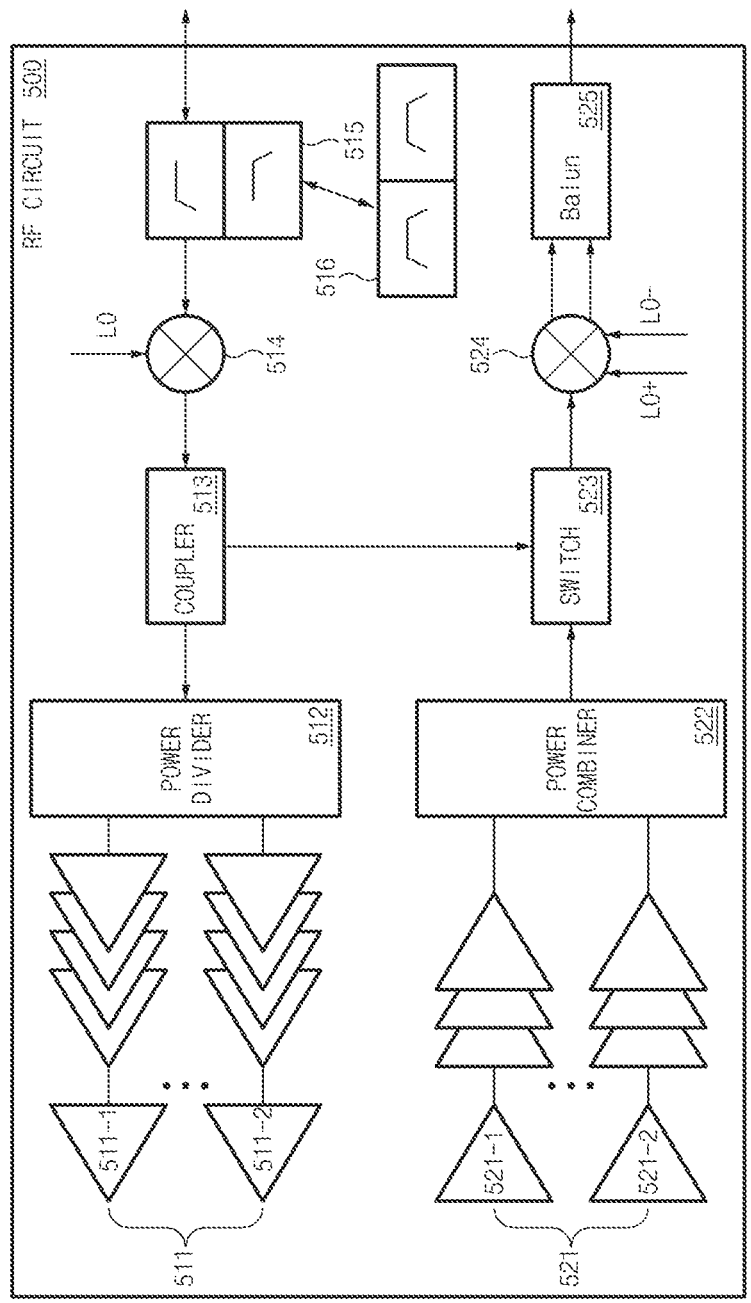
FIG. 5 is a structural diagram of an RF circuit according to an embodiment.

FIG. 5 is a structural diagram of an RF circuit according to an embodiment.

Referring to FIG. 5, an RF circuit 500 (e.g., the RF circuit 132 of FIG. 1) may include a feedback receiver (FBRX). For example, the RF circuit 500 may include a coupler 513 and transfer a coupling signal coupled from a Tx signal through a Rx path. In other words, the coupling signal and the Rx signal may share at least a part of the Rx path in the RF circuit 500. To this end, the RF circuit 500 may further include a switch 523. The RF circuit 500 may include amplifiers 511 and 521, a power divider 512, the coupler 513, a power combiner 522, a mixer 514, the switch 523, a mixer 524, a balun 525, a diplexer 515 and a duplexer 516.

According to one embodiment, the RF circuit 500 may have an FBRX structure in the RF circuit 200 of FIG. 2. For example, the RF circuit 500 may support the TDD scheme and operate as an FBRX using an Rx path at a transmission timing. Some configurations of the RF circuit 500 may be the same as or similar to some configurations of the RF circuit 200 of FIG. 2. For example, the amplifiers 511 and 521, the power divider 512, the power combiner 522, the mixer 514, the mixer 524, the balun 525, the diplexer 515 and the duplexer 516 in the RF circuit 500 may be respectively the same as or similar to the amplifiers 211 and 221, the power divider 212, the power combiner 222, the mixer 213, the mixer 223, the balun 224, the diplexer 215 and the duplexer 216 in FIG. 2.

According to one embodiment, the RF circuit 500 may include an Rx path and a Tx path. The Rx path may include the low noise amplifier(s) 521, the power combiner 522, the switch 523, the mixer 524, and the balun 525. The Tx path may include the mixer 514, the coupler 513, the power divider 512, and the power amplifier(s) 511.

According to an embodiment, a coupling path may be disposed between the coupler 513 and the switch 523. The coupling path may be a path through which a signal coupled by a coupler is transferred.

According to one embodiment, the coupler 513 may feed back at least a part of a Tx signal in the direction of an IF circuit (e.g., the IF circuit 120 of FIG. 1). According to one embodiment, the coupler 513 may feed back at least a part of the Tx signal output from the mixer 514. The signal fed back by the coupler 513 may be referred to as a feedback signal or a coupling signal.

According to one embodiment, the Tx signal output from the coupler 513 may be input to the power divider 512, and the coupling signal output from the coupler 513 may be transferred to the Rx path.

According to one embodiment, the RF circuit 500 may include the switch 523 to transfer the coupling signal through the Rx path. The switch 523 may form a path to selectively transmit the coupling signal or the Rx signal to the mixer 524.

According to one embodiment, the switch 523 may include a first terminal connected to the coupling path for transferring a coupling signal, a second terminal electrically connected to an Rx antenna, and a third terminal electrically connected to an Rx signal output terminal of the RF circuit 500. The switch 523 may be selectively connected to the first terminal or the second terminal. The switch 523 may be, for example, an SPDT.

According to one embodiment, the switch 523 may be disposed between the power combiner 522 and the mixer 524. According to one embodiment, the second terminal of the switch 523 may be electrically connected to the power combiner 522, and the third terminal may be electrically connected to the mixer 524. According to one embodiment, the RF circuit 500 may selectively obtain one of a coupling signal and an Rx signal, and the selected signal may be output through the Rx path.

According to one embodiment, the mixer 514 may be disposed between the coupler 513 and the diplexer 515. The Tx signal output from the diplexer 515 may be input to the mixer 514.

According to one embodiment, the signal output from the switch 523 may be input to the mixer 524, and the mixer 524 may output an IF signal using LO+ and LO− signals and a signal output from the switch 523. An image signal generated at this time may be suppressed by the balun 525. The IF signal which is output may be transferred to the outside of the RF circuit 500 through the balun 525. Here, the signal output from the switch 523 may be a coupling signal or an Rx signal. The coupling signal and the Rx signal may be signals in an RF band.

According to one embodiment, the RF circuit 500 may include a Tx port and an Rx port separately. The Tx port may be a port through which the RF circuit 500 receives a Tx signal from the outside. The Tx port may be electrically connected to the diplexer 515. The Rx port may be a port through which the RF circuit 500 transfers an Rx signal or a coupling signal to the outside. The Rx port may be electrically connected to the balun 525.

As illustrated in FIG. 5, when the coupler 513 is disposed before the power divider 512, a closed-loop power calibration may be possible using a small number of couplers. The closed-loop calibration may have the advantage of reducing a calibration speed for electronic devices with multiple modules. The FBRX may be implemented using only one coupler, which allows more space to be secured in the module. According to one embodiment, the FBRX may be implemented with the structure of FIG. 5 because a fixed voltage may be used due to an efficiency of a modulator in a high frequency band (e.g., 28 GHz band), and an operating characteristic of a power amplifier is not variant like average power tracking (APT) or envelope tracking (ET) in a band of less than 3 GHz.

Figure 6:
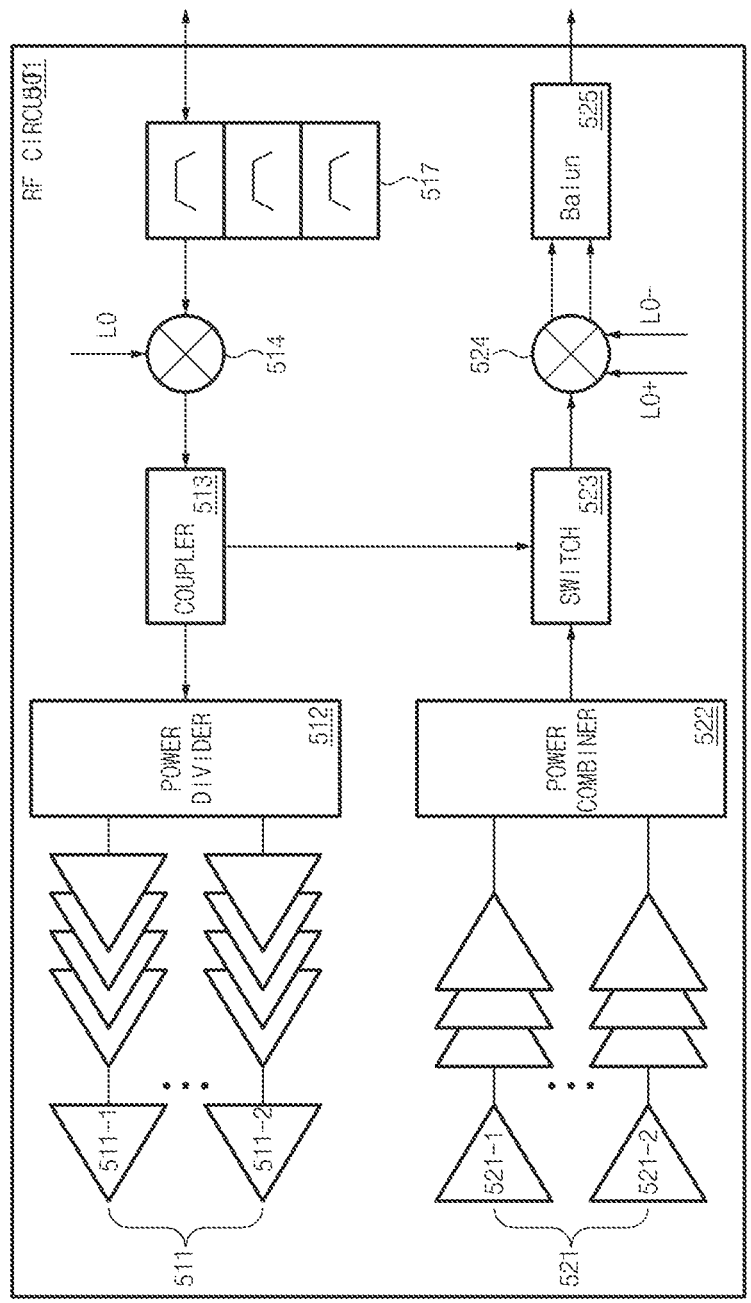
FIG. 6 is a structural diagram of an RF circuit according to an embodiment.

FIG. 6 is a structural diagram of an RF circuit according to an embodiment.

Referring to FIG. 6, an RF circuit 501 (e.g., the RF circuit 132 of FIG. 1) may include a triplexer 517 at an input terminal. Some configurations of the RF circuit 501 may be the same as or similar to the RF circuit 500. For example, the amplifier(s) 511 and 521, the power divider 512, the power combiner 522, the coupler 513, the mixer 514, the mixer 524, the switch 523, and the balun 525 may be respectively the same as or similar to the configurations of FIG. 5.

According to one embodiment, the RF circuit 501 may obtain a VCO signal, a control signal, and a Tx signal through a Tx port using the triplexer 517. The triplexer 517 may be electrically connected to the mixer 514.

The structures of the RF circuits of FIGS. 5 and 6 may be variously modified. For example, the RF circuits of FIGS. 5 and 6 may be modified to include one port connected to the outside as shown in FIGS. 2 and 3.

Figure 7:
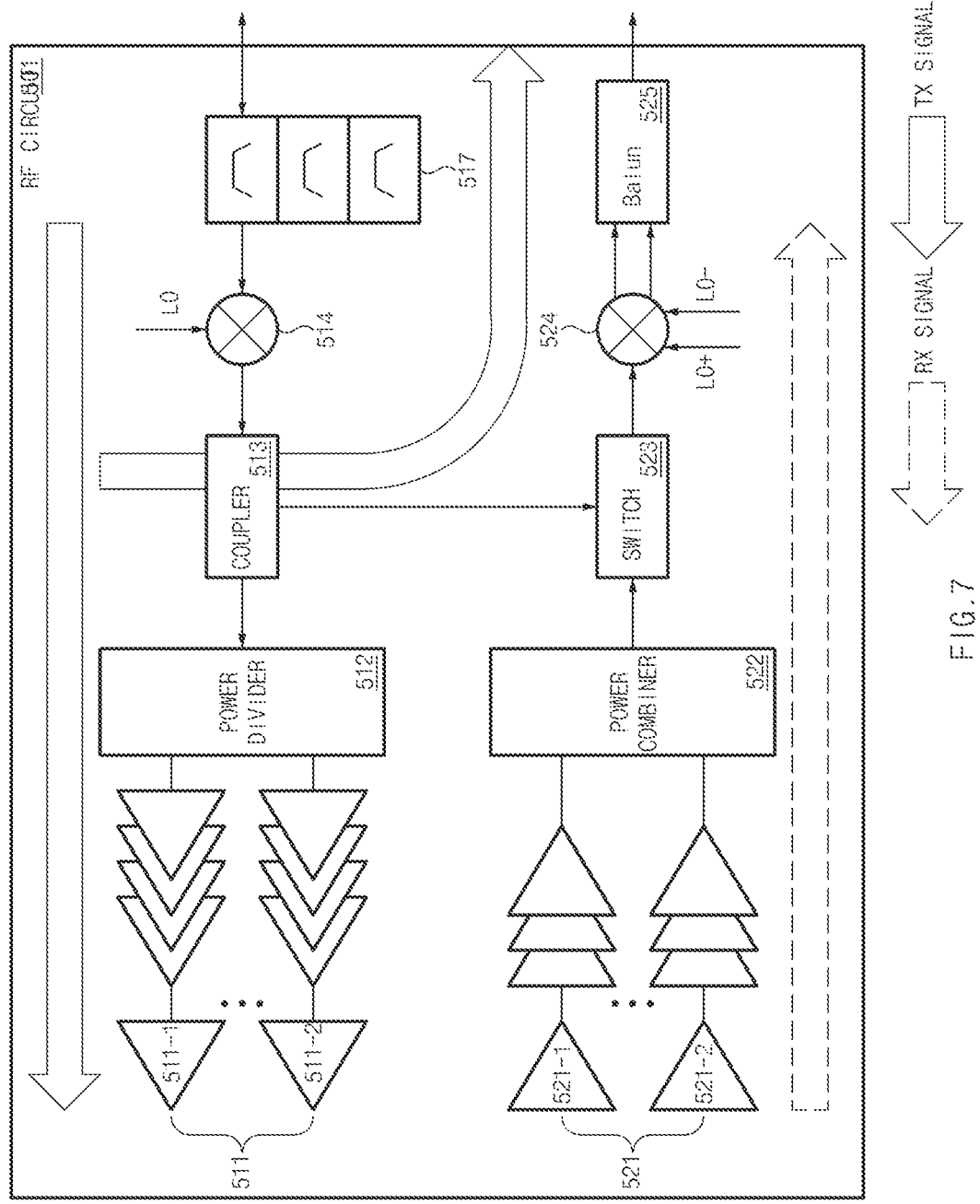
FIG. 7 is a diagram for describing an operation of the RF circuit of FIG. 6 according to an embodiment.

FIG. 7 is a diagram for describing an operation of the RF circuit of FIG. 5 according to an embodiment.

Although the operation of the RF circuit 501 of FIG. 6 is illustrated in FIG. 7, the following embodiments may be applied to the RF circuit 500 of FIG. 5.

According to one embodiment, while the RF circuit 501 performs transmission operation, the switch 523 may be connected in the direction of the coupler 513, and the RF circuit 501 may operate like the FBRX. The switch 523 may be connected to a coupling path, and may transfer the coupling signal to an Rx signal output terminal. The Tx signal may be transferred to an antenna module through a Tx path, and at least a part of a Tx signal may be transferred to an Rx path through the coupler 513 and the switch 523. The coupling signal transferred to the Rx path may be output through the mixer 524 and the balun 525.

According to one embodiment, in operation in which the RF circuit 500 performs Rx operation, the switch 523 may be connected to the Rx path. The switch 523 may be electrically connected to the power combiner 522, for example. The signal obtained through the antenna module may be output through the low noise amplifier 521, the power combiner 522, the switch 523, the mixer 524, and the balun 525.

According to one embodiment, a signal output from the balun 525 may be transferred to an IF circuit (e.g., the IF circuit 120 of FIG. 1) through a cable (e.g., the cable 140 of FIG. 1).

Figure 8:
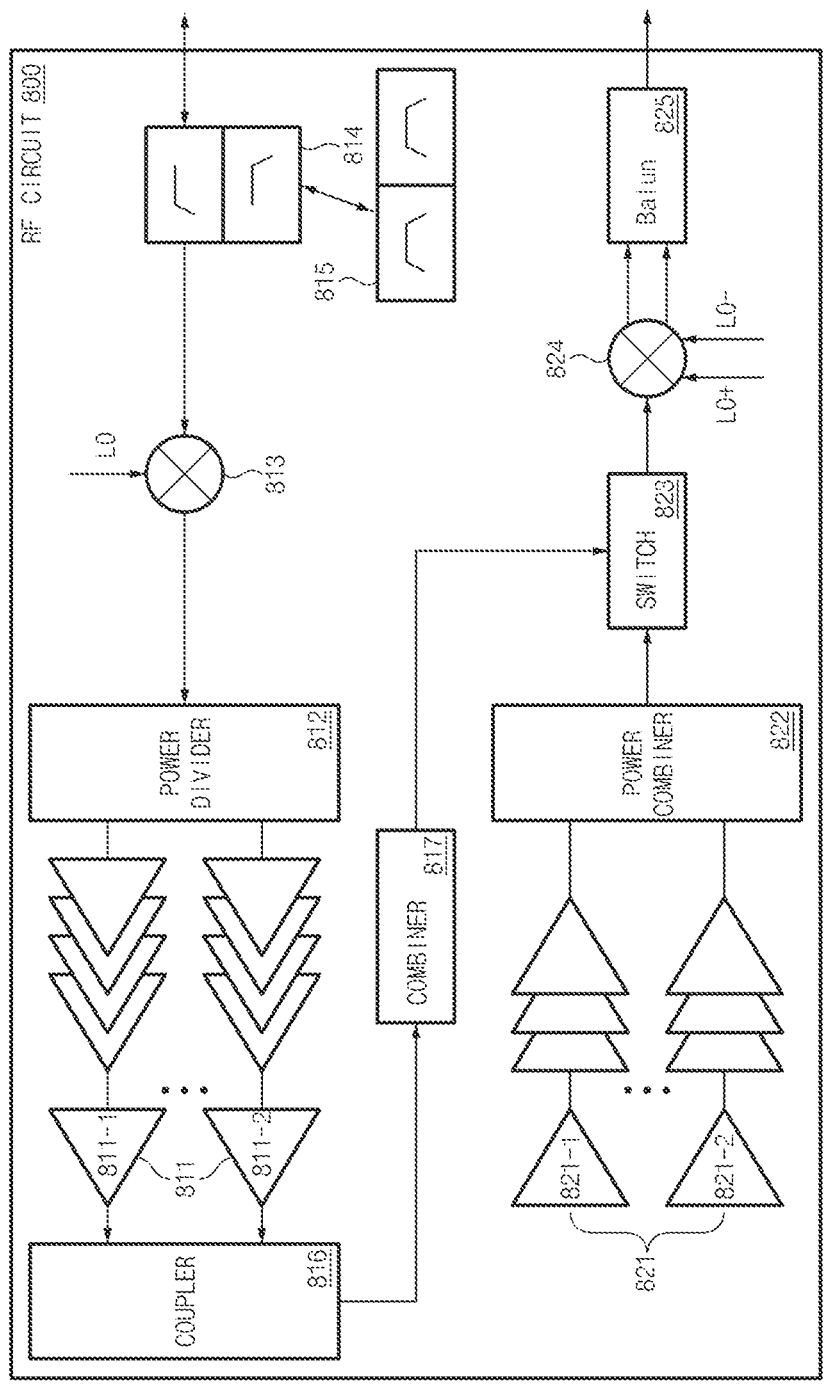
FIG. 8 is a structural diagram of an RF circuit according to an embodiment.

FIG. 8 is a structural diagram of an RF circuit according to an embodiment.

Referring to FIG. 8, an RF circuit 800 may include a coupler 816 at an output terminal of an antenna module (e.g., the antenna module 131 of FIG. 1) in a Tx path, and use an Rx path to transfer a signal coupled through the coupler 816. To this end, the RF circuit 800 may include a combiner 817 and a switch 823. According to one embodiment, the RF circuit 800 may include amplifiers 811 and 821, a power divider 812, a power combiner 822, a mixer 813, a mixer 824, a balun 825, a duplexer 814, a diplexer 815 the coupler 816, the combiner 817, and the switch 823.

According to one embodiment, some configurations of the RF circuit 800 may be the same as or similar to some configurations of the RF circuit 500 of FIG. 5. For example, the amplifiers 811 and 821, the power divider 812, the power combiner 822, the switch 823, the mixer 813, the mixer 824, the duplexer 814, the diplexer 815 and the balun 825 in the RF circuit 800 may be respectively the same as or similar to the amplifiers 511 and 521, the power divider 512, the power combiner 522, the switch 523, the mixer 514, the mixer 524, the diplexer 515, the duplexer 516, and the balun 525 in the RF circuit 500.

According to one embodiment, the RF circuit 800 may include an Rx path and a Tx path. The Rx path may include the low noise amplifier(s) 821, the power combiner 822, the switch 823, the mixer 824, and the balun 825. The Tx path may include a mixer 814, a coupler 813, the power divider 812, and the power amplifier(s) 811.

According to an embodiment, a coupling path may be disposed between the coupler 816 and the switch 823. The coupling path may be a path through which a signal coupled by a coupler is transferred. The coupling path may include the combiner 817 that combines signals output from the coupler 816.

According to one embodiment, the coupler 816 may be disposed in front of the power amplifier(s) 811, and may transfer some of Tx signals output from the power amplifier(s) 811 to the coupling path.

According to one embodiment, the coupler 816 may include a plurality of couplers. Each of the plurality of couplers may obtain a signal which is output from the power divider 812 and amplified for each of the power amplifier(s) 811 as input. For example, one coupler may obtain a signal output from the power amplifier(s) 811-1 as an input and transfer the signal to an antenna module and/or to a coupling path. Another coupler may obtain a signal output from the power amplifier(s) 811-2 as an input and transfer the signal to the antenna module and/or to the coupling path.

According to one embodiment, the combiner 817 may combine the coupling signals coupled by the coupler 816. The combiner 817 may be disposed between the coupler 816 and the switch 823.

According to one embodiment, the RF circuit 800 may include the switch 823, and the switch 823 may be disposed such that the coupling signal shares an Rx path with an Rx signal. The switch 823 may select the coupling signal or the Rx signal.

According to one embodiment, the switch 823 may include a first terminal connected to the coupling path for transferring a coupling signal, a second terminal electrically connected to an Rx antenna, and a third terminal electrically connected to an Rx signal output terminal of the RF circuit 800. The first terminal may be electrically connected to an output terminal of the combiner 817. The switch 823 may be selectively connected to the first terminal or the second terminal. The switch 823 may be, for example, an SPDT.

According to one embodiment, the switch 823 may be disposed between the power combiner 822 and the mixer 824. According to one embodiment, the second terminal of the switch 823 may be electrically connected to the power combiner 822, and the third terminal may be electrically connected to the mixer 824. According to one embodiment, the RF circuit 800 may selectively obtain one of a coupling signal and an Rx signal, and the selected signal may be output through the Rx path.

According to one embodiment, the signal output from the switch 823 may be input to the mixer 824, and the mixer 824 may output an IF signal using LO+ and LO− signals and a signal output from the switch 823. An image signal generated at this time may be suppressed by the balun 825. The IF signal which is output may be transferred to the outside of the RF circuit 800 through the balun 825. Here, the signal output from the switch 823 may be a coupling signal or an Rx signal. The coupling signal and the Rx signal may be signals in an RF band, for example the mmWave band.

According to one embodiment, the RF circuit 800 may include a Tx port and an Rx port which are separate from each other. The Tx port may be a port through which the RF circuit 800 receives a Tx signal from the outside. The Tx port may be electrically connected to the diplexer 815. The Rx port may be a port through which the RF circuit 800 transfers an Rx signal or a coupling signal to the outside. The Rx port may be electrically connected to the balun 825.

As shown in FIGS. 5 and 8, the RF circuit 800 may not have a path and a port for detecting the coupling signal because the coupling signal shares the Rx port with the Rx signal.

Figure 9:
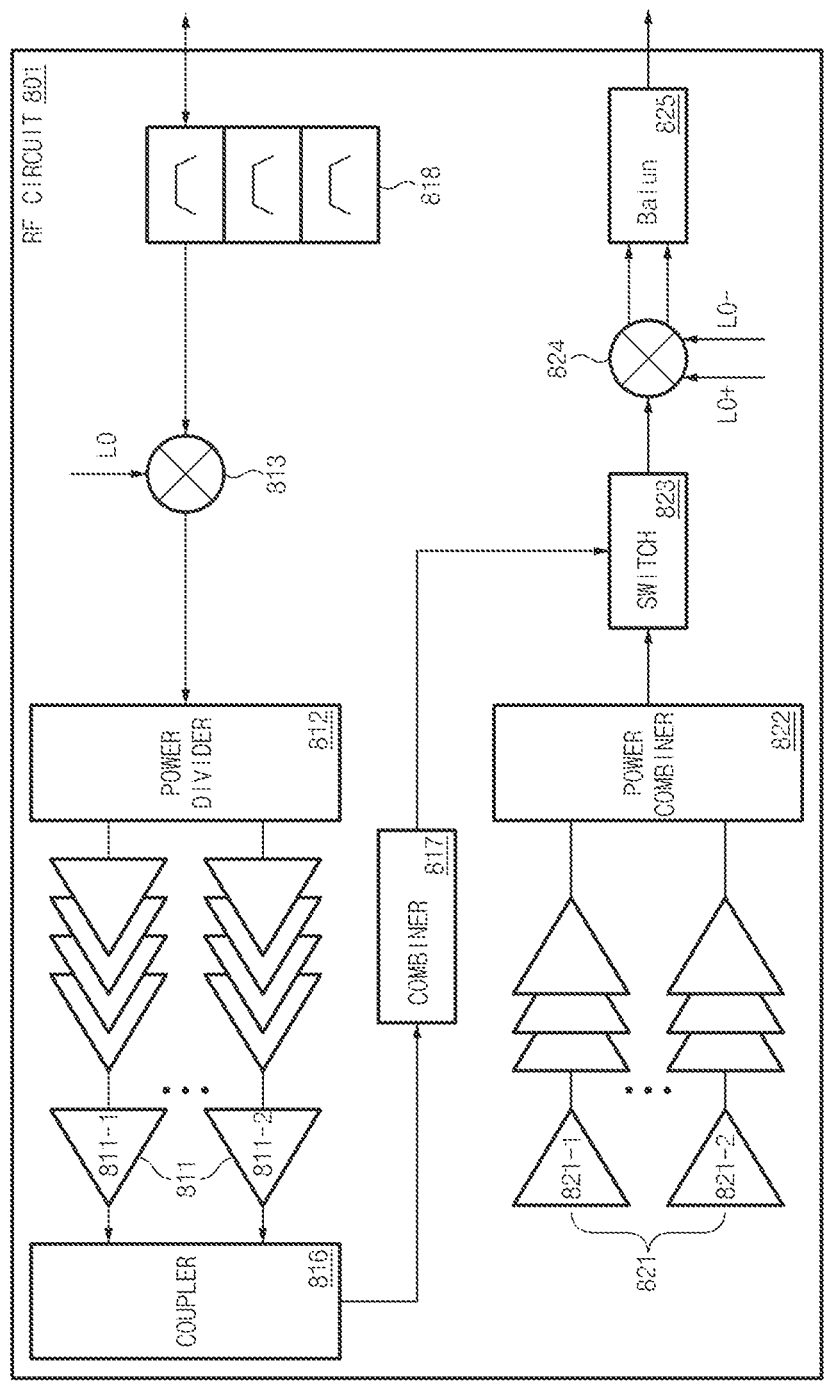
FIG. 9 is a structural diagram of an RF circuit according to an embodiment.

FIG. 9 is a structural diagram of an RF circuit according to an embodiment.

Referring to FIG. 9, an RF circuit 801 (e.g., the RF circuit 132 of FIG. 1) may include a triplexer 818 at an input terminal of a Tx signal. Some configurations of the RF circuit 801 may be the same as or similar to the RF circuit 800. For example, the amplifier(s) 811 and 821, the power divider 812, the power combiner 822, the mixer 813, the mixer 824, the balun 825, the coupler 816, and the combiner 817, and the switch 823 may be respectively the same as or similar to the configurations of FIG. 8.

According to one embodiment, the RF circuit 801 may obtain a VCO signal, a control signal, and a Tx signal through a Tx port using the triplexer 817. The triplexer 817 may be electrically connected to the mixer 813.

The structures of the RF circuits of FIGS. 8 and 9 may be variously modified. For example, the RF circuits of FIGS. 8 and 9 may be modified to include one port connected to the outside as shown in FIGS. 2 and 3.

Figure 10:
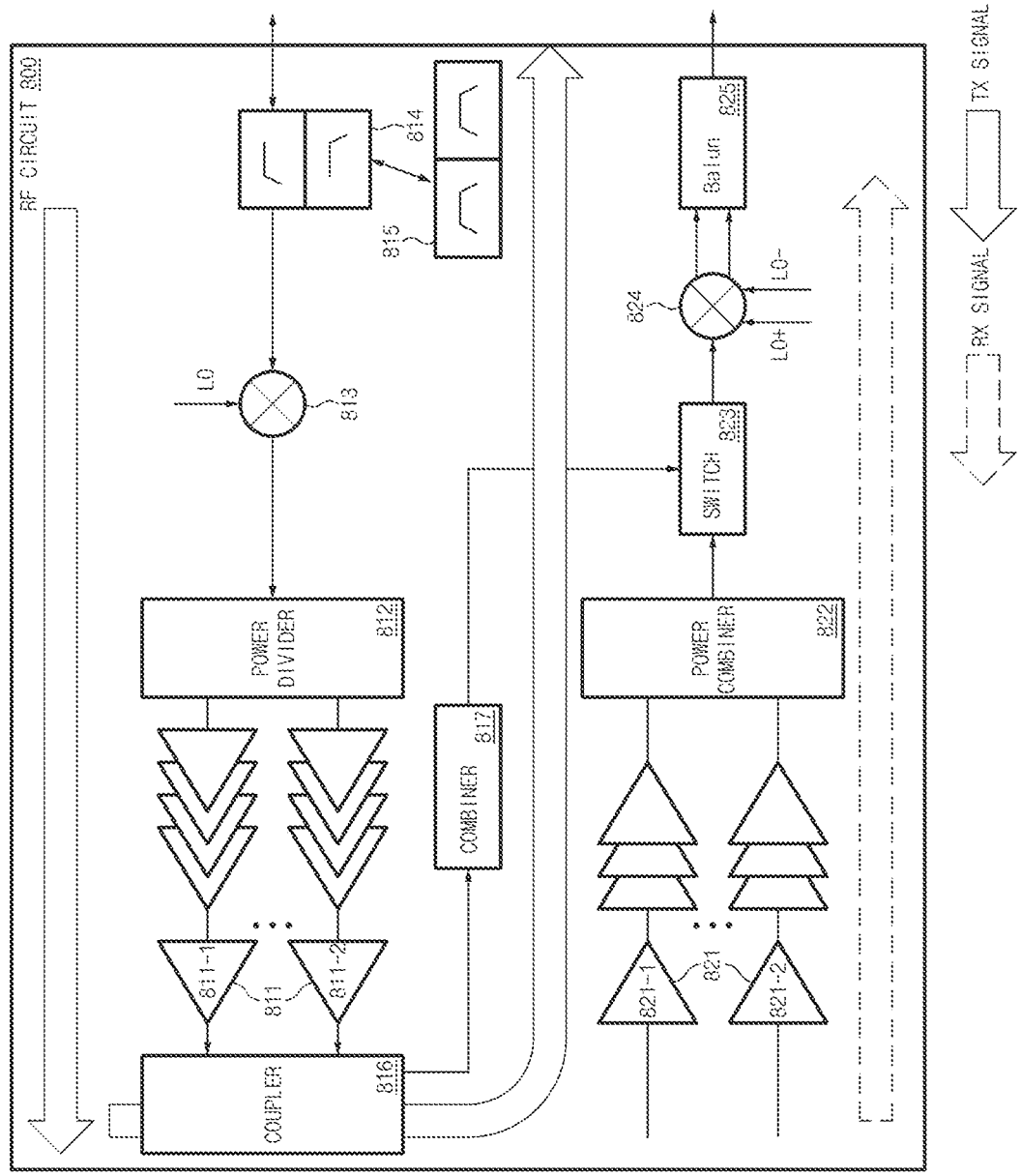
FIG. 10 is a diagram for describing an operation of the RF circuit of FIG. 8 according to an embodiment.

FIG. 10 is a diagram for describing an operation of the RF circuit of FIG. 8 according to an embodiment.

Although the operation of the RF circuit 800 of FIG. 8 is illustrated in FIG. 10, the following embodiments may be applied to the RF circuit 801 of FIG. 9.

According to one embodiment, while the RF circuit 800 performs Tx operation, the switch 823 may be connected in the direction of the coupler 816 (or the combiner 817), and the RF circuit 800 may operate like the FBRX. The switch 823 may be connected to a coupling path, and may transfer the coupling signal to an output terminal of the Rx path. The Tx signal may be transferred to an antenna module (e.g., the antenna module 134 of FIG. 1). For example, the Tx signal may be converted into an RF signal at the mixer 813, power for antennas may be distributed at the power divider 812, amplified at the amplifier(s) 811 and transferred to the antenna through the coupler 816 or at least a part of the Tx signal may be transferred to the Rx path through the coupler 816 and the switch 823. The coupling signal transferred to the Rx path may be output through the mixer 824 and the balun 825.

According to one embodiment, in operation in which the RF circuit 800 performs Rx operation, the switch 823 may be connected to the Rx path. The switch 823 may be electrically connected to the power combiner 822, for example. The Rx signal obtained through the antenna module may be output through the low noise amplifier 821 the power combiner 822, the switch 823, the mixer 824, and the balun 825.

According to one embodiment, a signal output from the balun 825 may be transferred to an IF circuit (e.g., the IF circuit 120 of FIG. 1) through a cable (e.g., the cable 140 of FIG. 1).

Figure 11:
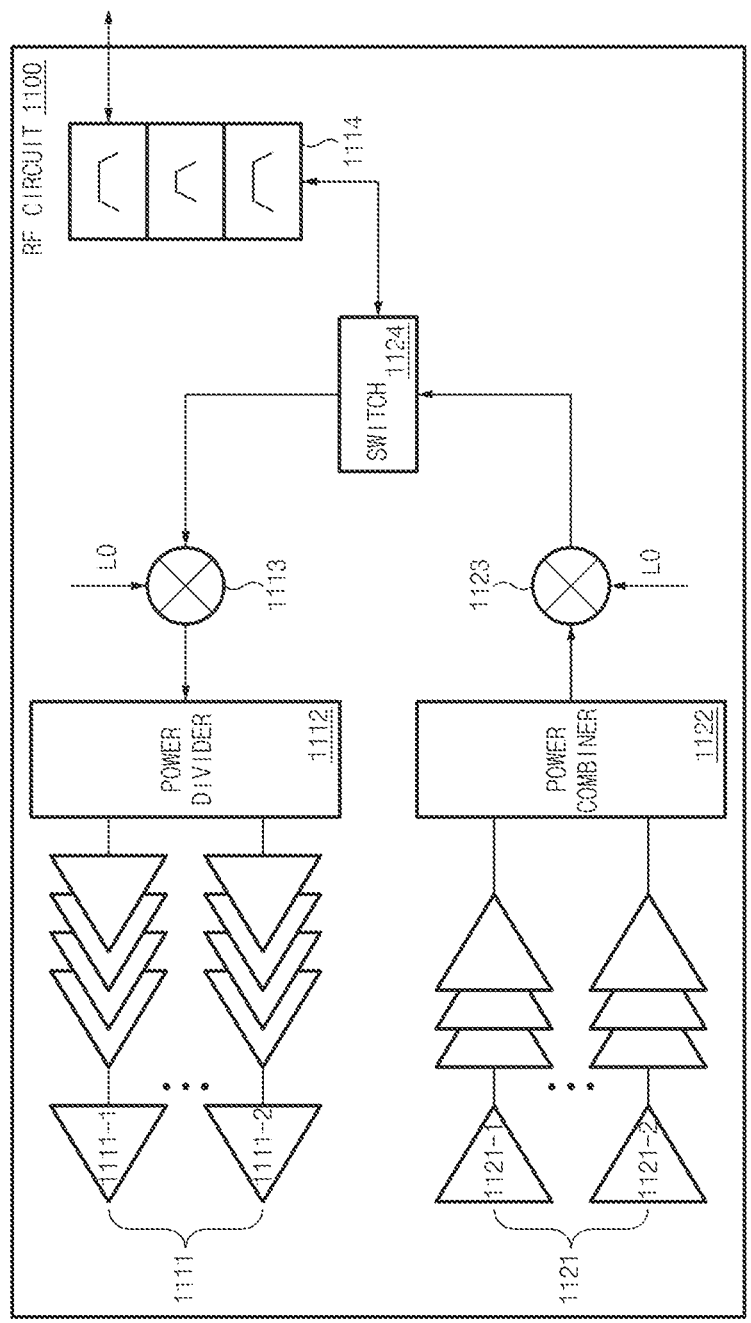
FIG. 11 is a structural diagram of an RF circuit according to an embodiment.

FIG. 11 is a structural diagram of an RF circuit according to an embodiment.

Referring to FIG. 11, an RF circuit 1100 may include amplifiers 1111 and 1121, a power divider 1112, a power combiner 1122, a mixer 1113, a mixer 1123, a switch 1124, and a triplexer 1114. The amplifiers 1111 and 1121, the power divider 1112, the power combiner 1122, and the mixer 1113 in the RF circuit 1100 may be respectively the same as or similar to the amplifiers 211 and 221, the power divider 212, the power combiner 222, and the mixer 213 in FIGS. 2 and 3.

Referring to FIG. 11, the mixer 1123 may convert a signal received in an RF or mmWave band into an IF signal. The mixer 1123 may convert the Rx signal using an LO signal of a single phase. In this case, the RF circuit 1100 may include a filter to suppress an image signal.

According to one embodiment, the RF circuit 1100 may support the TDD scheme. To this end, the RF circuit 1100 may include the switch 1124 for selecting an Rx signal or a Tx signal for each time interval. The switch 1124 may transfer the Tx signal output from the triplexer 1114 to the mixer 1113 or the Rx signal output from the mixer 1123 to the triplexer 1114.

According to one embodiment, the RF circuit 1100 may include one port capable of inputting and outputting both the Tx signal and the Rx signal. The one port may be electrically connected to the triplexer 1114.

As described above, in a high frequency band, it may be effective to suppress an image signal using the balun and +/−LO signals as in FIGS. 2, 5 and 8, compared with using the filter as shown in FIG. 11.

According to one embodiment, an electronic device may include an antenna for transmitting and receiving a signal in an RF frequency band, and an RF circuit configured to process the signal in the RF frequency band.

According to one embodiment, the RF circuit may include an Rx path for transferring a first signal received through the antenna, a Tx path for transferring a second signal output from an amplifier to the antenna, and a coupler for transferring at least a part of the second signal obtained in the Tx path to the Rx path.

According to one embodiment, the Rx path may include a low noise amplifier, and a down converter that converts the first signal into an intermediate frequency (IF) signal based on a local oscillator (LO) signal and the first signal.

According to one embodiment, the Rx path may include a selection circuit that selects at least a part of the first signal or the second signal. According to one embodiment, the selection circuit may be disposed between the low noise amplifier and the down converter, and the low noise amplifier may be electrically connected to the antenna.

According to one embodiment, the selection circuit may include a switch including a first terminal electrically connected to the low noise amplifier, a second terminal electrically connected to the coupler, and a third terminal connected to the down converter, and the switch may be configured to selectively connect the first terminal or the second terminal to the third terminal.

According to one embodiment, the LO signal may include LO+ and LO− signals. According to one embodiment, the Rx path may include a balun electrically connected to an output terminal of the down converter.

According to one embodiment, the Tx path may include a power divider that distributes power to the antenna, and the coupler may be electrically connected to an input terminal of the power divider.

According to one embodiment, the Tx path may include an up converter that converts the second signal into a signal in an RF frequency band, and the coupler may be electrically connected to an output terminal of the up converter.

According to one embodiment, the Tx path may include a power amplifier that amplifies power of the second signal, and the coupler may be electrically connected to an output terminal of the power amplifier.

According to one embodiment, a combiner that combines outputs of the coupler may be included between the coupler and the switch.

According to one embodiment, the antenna may include an array antenna. The antenna may transmit and receive a signal in the mmWave frequency band.

According to one embodiment, the RF circuit may support a time division duplex (TDD).

According to one embodiment, an RF circuit may include an Rx path including a low noise amplifier and a down converter that converts an Rx signal into an IF signal based on the Rx signal and a first local oscillator (LO) signal, a Tx path including an up converter that converts a Tx signal into a signal in an mmWave band based on the Tx signal and a second local oscillator (LO), and a coupling path for transferring at least a part of the Tx signal to the Rx path.

According to one embodiment, the RF circuit may include a selection circuit that selectively transfers a coupled signal or the Rx signal through the Rx path. According to one embodiment, the selection circuit may be disposed between the low noise amplifier and the down converter.

According to one embodiment, the Tx path may include a power amplifier and a coupler, and the coupler may be disposed between the power amplifier and the up converter.

Figure 12:
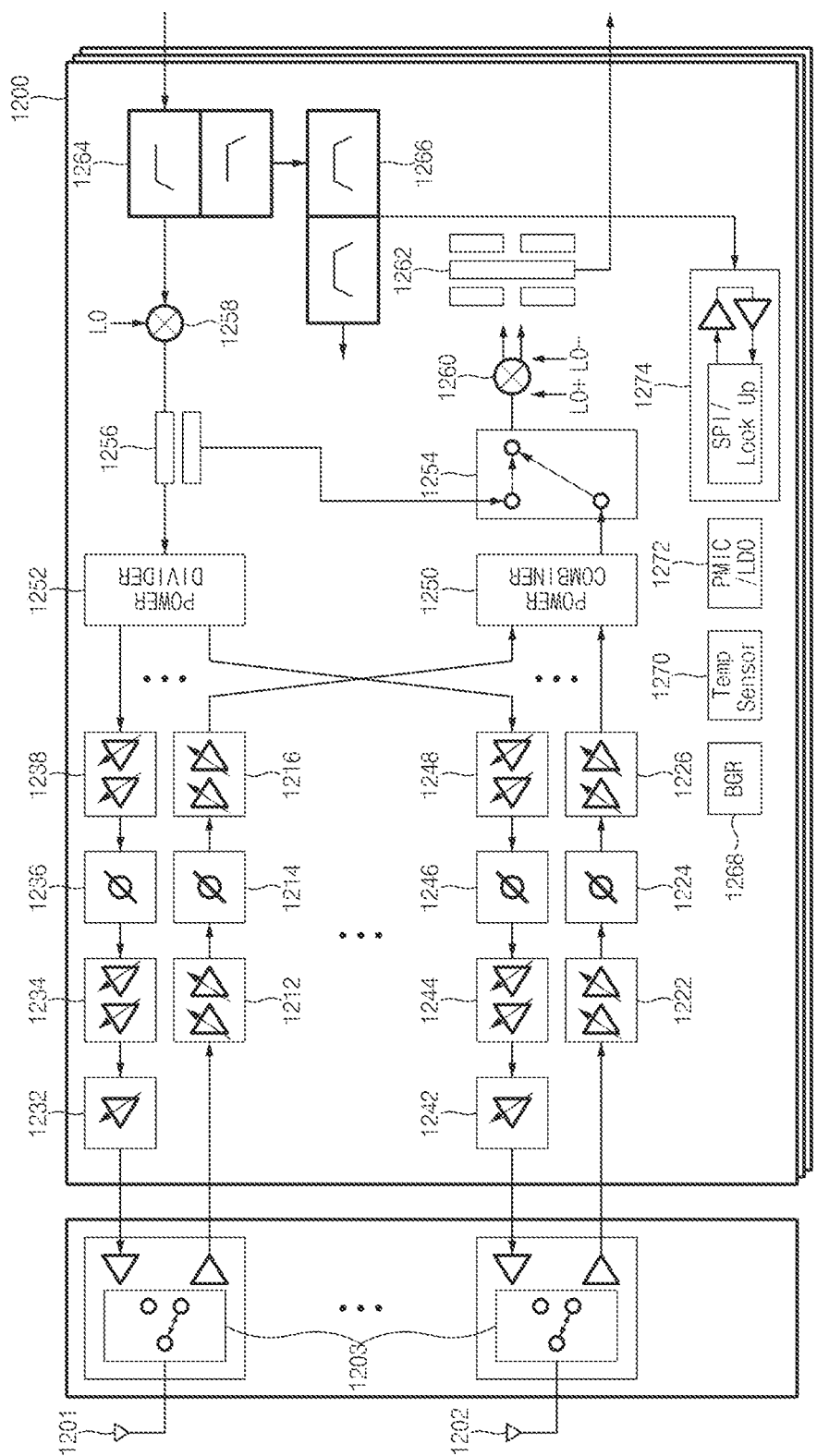
FIG. 12 is a detailed structural diagram of an RF module according to an embodiment.

FIG. 12 is a detailed structural diagram of an RF module according to an embodiment.

According to one embodiment, an RF module (e.g., the RF module 130 of FIG. 1) may include an RF circuit 1200 (e.g., the RF circuit 132 of FIG. 1), a front end module (FEM) 1203 and an antenna 1201.

According to one embodiment, the RF circuit 1200 may include an Rx path and a Tx path. According to one embodiment, an Rx path may include a low noise amplifier (LNA) 1212, a phase shifter (PS) 1214 and a range doppler algorithm 1216. According to one embodiment, a Tx path may include a PA 1232, a photo parametric amplifier (PPA), a PS 1236, and a positive metal oxide semiconductor (PMOS) input self-biased differential amplifier 1238.

According to one embodiment, each Rx path may be connected to a power combiner 1250 and the Tx path may be coupled to a power divider 1252. The power combiner 1250 and/or the power divider 1252 may be of, for example, 2 ways, 4 ways, 8 ways, and 16 ways.

According to one embodiment, the RF circuit 1200 may include a plurality of Rx paths and Tx paths. Each of the Rx paths and Tx paths may be coupled to the power combiner 1250 and the power divider 1252. According to one embodiment, the Tx path may be electrically connected to a coupler 1256, and the RF signal output from the coupler 1256 may be transferred to the Tx path through the power divider 1252. At least a part of an RF signal output from the coupler 1256 may be coupled and transferred to a signal Rx path. The RF signal may be a signal which is converted by a mixer 1258.

According to one embodiment, a switch 1254 may be connected to the power combiner 1250. According to one embodiment, the switch 1254 may be connected in the direction of the coupler 1256 or the power combiner 1250.

A signal output from the switch 1254 may be converted into an IF signal by a mixer 1260. In this case, an LO+ signal and an LO− signal may be input to the mixer 1260. A signal output from the mixer 1260 may be output through an Rx port through a balun 1262.

According to one embodiment, the Tx path may include a diplexer 1264 and a duplexer 1266. The duplexer 1266 may output a VCO signal and a control signal. According to one embodiment, the diplexer 1264 may obtain a Tx signal through a Tx port and separate the Tx signal from the VCO signal and the control signal.

According to one embodiment, the RF circuit 1200 may further include a bandgap voltage reference (BGR) 1268, a temperature sensor 1270, a power management integrated circuit (PMIC)/low dropout regulator (LDO) 1272, and a serial peripheral interface (SPI)/look up library 1274. According to one embodiment, the duplexer 1266 may be electrically connected to the SPI/lookup library 1274.

According to one embodiment, the FEM(s) 1203 may be at least one module located in front of the RF circuit 1200. The FEM(s) 1203 may transfer signals output from the RF circuit 1200 to corresponding antennas 1201 and 1202. According to one embodiment, the FEM(s) 1203 may include a switch or the like.

According to one embodiment, the antennas 1201 and 1202 may transmit and receive a signal in an mmWave band to and from an external device. The antennas 1201 and 1202 may be array antennas. The antennas 1201 and 1202 may be used as Tx antennas and/or Rx antennas. The FEM(s) 1203 may include a switch for changing the transmission/reception usage. According to one embodiment, the antennas 1201 and 1202 may configure an antenna module (e.g., the antenna module 134 of FIG. 1) or may be implemented as an antenna module.

Figure 13:
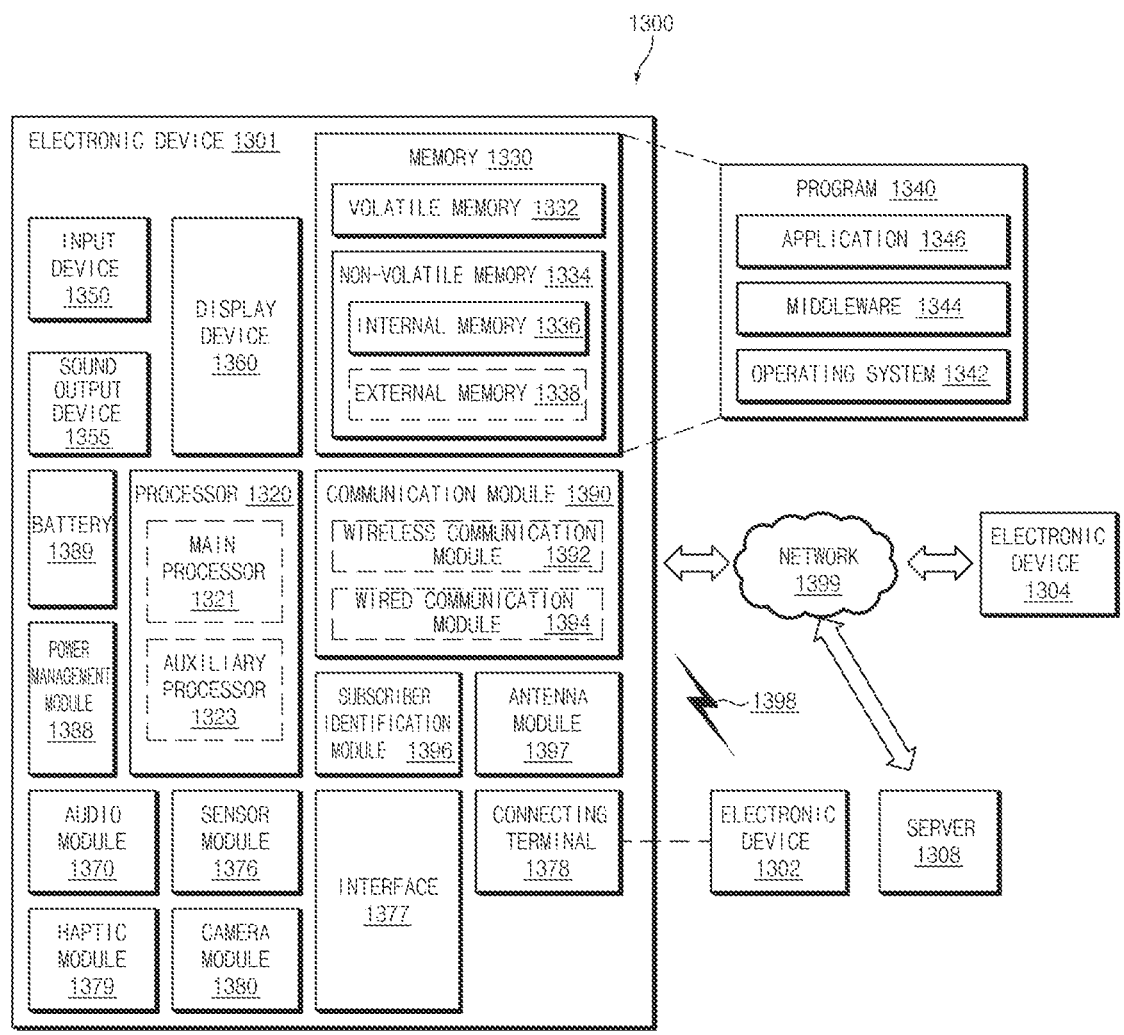
FIG. 13 is a block diagram of an electronic device in a network environment according to various embodiments.

FIG. 13 is a block diagram of an electronic device in a network environment according to various embodiments.

Referring to FIG. 13, an electronic device 1301 may communicate with an electronic device 1302 through a first network 1398 (e.g., a short-range wireless communication) or may communicate with an electronic device 1304 or a server 1308 through a second network 1399 (e.g., a long-distance wireless communication) in a network environment 1300. According to an embodiment, the electronic device 1301 may communicate with the electronic device 1304 through the server 1308. According to an embodiment, the electronic device 1301 may include a processor 1320, a memory 1330, an input device 1350, a sound output device 1355, a display device 1360, an audio module 1370, a sensor module 1376, an interface 1377, a haptic module 1379, a camera module 1380, a power management module 1388, a battery 1389, a communication module 1390, a subscriber identification module 1396, and an antenna module 1397. According to some embodiments, at least one (e.g., the display device 1360 or the camera module 1380) among components of the electronic device 1301 may be omitted or other components may be added to the electronic device 1301. According to some embodiments, some components may be integrated and implemented as in the case of the sensor module 1376 (e.g., a fingerprint sensor, an iris sensor, or an illuminance sensor) embedded in the display device 1360 (e.g., a display).

The processor 1320 may operate, for example, software (e.g., a program 1340) to control at least one of other components (e.g., a hardware or software component) of the electronic device 1301 connected to the processor 1320 and may process and compute a variety of data. The processor 1320 may load a command set or data, which is received from other components (e.g., the sensor module 1376 or the communication module 1390), into a volatile memory 1332, may process the loaded command or data, and may store result data into a nonvolatile memory 1334. According to an embodiment, the processor 1320 may include a main processor 1321 (e.g., a central processing unit or an application processor) and an auxiliary processor 1323 (e.g., a graphic processing device, an image signal processor, a sensor hub processor, or a communication processor), which operates independently from the main processor 1321, additionally or alternatively uses less power than the main processor 1321, or is specified to a designated function. In this case, the auxiliary processor 1323 may operate separately from the main processor 1321 or embedded.

In this case, the auxiliary processor 1323 may control, for example, at least some of functions or states associated with at least one component (e.g., the display device 1360, the sensor module 1376, or the communication module 1390) among the components of the electronic device 1301 instead of the main processor 1321 while the main processor 1321 is in an inactive (e.g., sleep) state or together with the main processor 1321 while the main processor 1321 is in an active (e.g., an application execution) state. According to an embodiment, the auxiliary processor 1323 (e.g., the image signal processor or the communication processor) may be implemented as a part of another component (e.g., the camera module 1380 or the communication module 1390) that is functionally related to the auxiliary processor 1323. The memory 1330 may store a variety of data used by at least one component (e.g., the processor 1320 or the sensor module 1376) of the electronic device 1301, for example, software (e.g., the program 1340) and input data or output data with respect to commands associated with the software. The memory 1330 may include the volatile memory 1332 or the nonvolatile memory 1334.

The program 1340 may be stored in the memory 1330 as software and may include, for example, an operating system 1342, a middleware 1344, or an application 1346.

The input device 1350 may be a device for receiving a command or data, which is used for a component (e.g., the processor 1320) of the electronic device 1301, from an outside (e.g., a user) of the electronic device 1301 and may include, for example, a microphone, a mouse, or a keyboard.

The sound output device 1355 may be a device for outputting a sound signal to the outside of the electronic device 1301 and may include, for example, a speaker used for general purposes, such as multimedia play or recordings play, and a receiver used only for receiving calls. According to an embodiment, the receiver and the speaker may be either integrally or separately implemented.

The display device 1360 may be a device for visually presenting information to the user of the electronic device 1301 and may include, for example, a display, a hologram device, or a projector and a control circuit for controlling a corresponding device. According to an embodiment, the display device 1360 may include a touch circuitry or a pressure sensor for measuring an intensity of pressure on the touch.

The audio module 1370 may convert a sound and an electrical signal in dual directions. According to an embodiment, the audio module 1370 may obtain the sound through the input device 1350 or may output the sound through an external electronic device (e.g., the electronic device 1302 (e.g., a speaker or a headphone)) wired or wirelessly connected to the sound output device 1355 or the electronic device 1301.

The sensor module 1376 may generate an electrical signal or a data value corresponding to an operating state (e.g., power or temperature) inside or an environmental state outside the electronic device 1301. The sensor module 1376 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 1377 may support a designated protocol wired or wirelessly connected to the external electronic device (e.g., the electronic device 1302). According to an embodiment, the interface 1377 may include, for example, an HDMI (high-definition multimedia interface), a USB (universal serial bus) interface, an SD card interface, or an audio interface.

A connecting terminal 1378 may include a connector that physically connects the electronic device 1301 to the external electronic device (e.g., the electronic device 1302), for example, an HDMI connector, a USB connector, an SD card connector, or an audio connector (e.g., a headphone connector).

The haptic module 1379 may convert an electrical signal to a mechanical stimulation (e.g., vibration or movement) or an electrical stimulation perceived by the user through tactile or kinesthetic sensations. The haptic module 1379 may include, for example, a motor, a piezoelectric element, or an electric stimulator.

The camera module 1380 may shoot a still image or a video image. According to an embodiment, the camera module 1380 may include, for example, at least one lens, an image sensor, an image signal processor, or a flash.

The power management module 1388 may be a module for managing power supplied to the electronic device 1301 and may serve as at least a part of a power management integrated circuit (PMIC).

The battery 1389 may be a device for supplying power to at least one component of the electronic device 1301 and may include, for example, a non-rechargeable (primary) battery, a rechargeable (secondary) battery, or a fuel cell.

The communication module 1390 may establish a wired or wireless communication channel between the electronic device 1301 and the external electronic device (e.g., the electronic device 1302, the electronic device 1304, or the server 1308) and support communication execution through the established communication channel. The communication module 1390 may include at least one communication processor operating independently from the processor 1320 (e.g., the application processor) and supporting the wired communication or the wireless communication. According to an embodiment, the communication module 1390 may include a wireless communication module 1392 (e.g., a cellular communication module, a short-range wireless communication module, or a GNSS (global navigation satellite system) communication module) or a wired communication module 1394 (e.g., an LAN (local area network) communication module or a power line communication module) and may communicate with the external electronic device using a corresponding communication module among them through the first network 1398 (e.g., the short-range communication network such as a Bluetooth, a WiFi direct, or an IrDA (infrared data association)) or the second network 1399 (e.g., the long-distance wireless communication network such as a cellular network, an internet, or a computer network (e.g., LAN or WAN)). The above-mentioned various communication modules 1390 may be implemented into one chip or into separate chips, respectively.

According to an embodiment, the wireless communication module 1392 may identify and authenticate the electronic device 1301 using user information stored in the subscriber identification module 1396 in the communication network.

The antenna module 1397 may include one or more antennas to transmit or receive the signal or power to or from an external source. According to an embodiment, the communication module 1390 (e.g., the wireless communication module 1392) may transmit or receive the signal to or from the external electronic device through the antenna suitable for the communication method.

Some components among the components may be connected to each other through a communication method (e.g., a bus, a GPIO (general purpose input/output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 1301 and the external electronic device 1304 through the server 1308 connected to the second network 1399. Each of the electronic devices 1302 and 1304 may be the same or different types as or from the electronic device 1301. According to an embodiment, all or some of the operations performed by the electronic device 1301 may be performed by another electronic device or a plurality of external electronic devices. When the electronic device 1301 performs some functions or services automatically or by request, the electronic device 1301 may request the external electronic device to perform at least some of the functions related to the functions or services, in addition to or instead of performing the functions or services by itself. The external electronic device receiving the request may carry out the requested function or the additional function and transmit the result to the electronic device 1301. The electronic device 1301 may provide the requested functions or services based on the received result as is or after additionally processing the received result. To this end, for example, a cloud computing, distributed computing, or client-server computing technology may be used.

The electronic device according to various embodiments disclosed in the present disclosure may be various types of devices. The electronic device may include, for example, at least one of a portable communication device (e.g., a smartphone), a computer device, a portable multimedia device, a mobile medical appliance, a camera, a wearable device, or a home appliance. The electronic device according to an embodiment of the present disclosure should not be limited to the above-mentioned devices.

It should be understood that various embodiments of the present disclosure and terms used in the embodiments do not intend to limit technologies disclosed in the present disclosure to the particular forms disclosed herein; rather, the present disclosure should be construed to cover various modifications, equivalents, and/or alternatives of embodiments of the present disclosure. With regard to description of drawings, similar components may be assigned with similar reference numerals. As used herein, singular forms may include plural forms as well unless the context clearly indicates otherwise. In the present disclosure disclosed herein, the expressions "A or B", "at least one of A or/and B", "A, B, or C" or "one or more of A, B, or/and C", and the like used herein may include any and all combinations of one or more of the associated listed items. The expressions "a first", "a second", "the first", or "the second", used in herein, may refer to various components regardless of the order and/or the importance, but do not limit the corresponding components. The above expressions are used merely for the purpose of distinguishing a component from the other components. It should be understood that when a component (e.g., a first component) is referred to as being (operatively or communicatively) "connected," or "coupled," to another component (e.g., a second component), it may be directly connected or coupled directly to the other component or any other component (e.g., a third component) may be interposed between them.

The term "module" used herein may represent, for example, a unit including one or more combinations of hardware, software and firmware. The term "module" may be interchangeably used with the terms "logic", "logical block", "part" and "circuit". The "module" may be a minimum unit of an integrated part or may be a part thereof. The "module" may be a minimum unit for performing one or more functions or a part thereof. For example, the "module" may include an application-specific integrated circuit (ASIC).

Various embodiments of the present disclosure may be implemented by software (e.g., the program 1340) including an instruction stored in a machine-readable storage media (e.g., an internal memory 1336 or an external memory 1338) readable by a machine (e.g., a computer). The machine may be a device that calls the instruction from the machine-readable storage media and operates depending on the called instruction and may include the electronic device (e.g., the electronic device 1301). When the instruction is executed by the processor (e.g., the processor 1320), the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components (e.g., the module or the program) may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device, comprising:
a plurality of antennas configured to transmit and receive a signal in a radio frequency (RF) frequency band; and
an RF circuit configured to process the signal in the RF frequency band,
wherein the RF circuit includes:
a reception (Rx) path configured to transfer a first signal received through the plurality of antennas;
a transmission (Tx) path configured to transfer a second signal to the plurality of antennas, and
a coupler configured to transfer at least a part of the second signal obtained in the Tx path to the Rx path,
wherein the Tx path includes a power divider configured to distribute power to at least one antenna among the plurality of antennas, and
wherein the coupler is electrically connected to an input terminal of the power divider to be disposed before the power divider.

2. The electronic device of claim 1, further comprising:
a low noise amplifier; and
a down converter configured to convert the first signal into an intermediate frequency (IF) signal based on a local oscillator (LO) signal and the first signal.

3. The electronic device of claim 2, wherein the Rx path includes a selection circuit configured to select at least a part of the first signal or the second signal.

4. The electronic device of claim 3, wherein the selection circuit is disposed between the low noise amplifier and the down converter, and
wherein the low noise amplifier is electrically connected to the plurality of antennas.

5. The electronic device of claim 4, wherein the selection circuit includes a switch including a first terminal electrically connected to the low noise amplifier, a second terminal electrically connected to the coupler, and a third terminal connected to the down converter, and
wherein the switch is configured to selectively connect the first terminal and the second terminal to the third terminal.

6. The electronic device of claim 3, wherein the LO signal includes LO+ and LO− signals.

7. The electronic device of claim 6, wherein the Rx path includes a balun electrically connected to an output terminal of the down converter.

8. The electronic device of claim 1, wherein the Tx path includes an up converter configured to convert the second signal into a signal in the RF frequency band, and
wherein the coupler is electrically connected to an output terminal of the up converter.

9. The electronic device of claim 1, wherein the Tx path includes a power amplifier configured to amplify power of the second signal, and
wherein the coupler is electrically connected to an output terminal of the power amplifier.

10. The electronic device of claim 9, further comprising a combiner configured to combine outputs of the coupler between the coupler and the switch.

11. A radio frequency (RF) circuit, comprising:
a reception (Rx) path including a down converter configured to convert an Rx signal into an intermediate frequency (IF) signal based on the Rx signal and a first local oscillator (LO) signal;
a transmission (Tx) path including an up converter configured to convert a Tx signal into a signal in an mmWave band based on a second local oscillator and the Tx signal; and
a coupling path configured to transfer at least a part of the Tx signal to the Rx path,
wherein the Rx path includes a mixer configured to generate the IF signal, and
wherein the mixer receives LO+ signal and LO− signal to suppress an image signal, the image signal generated by the Rx signal and a $2^{nd}$ harmonic of the first LO signal.

12. The RF circuit of claim 11, further comprising a selection circuit configured to selectively transfer a coupled signal or the Rx signal through the Rx path.

13. The RF circuit of claim 12, further comprising a low noise amplifier,
wherein the selection circuit is disposed between the low noise amplifier and the down converter.

14. The RF circuit of claim 11, wherein the Tx path includes a power amplifier and a coupler, and
wherein the coupler is disposed between the power amplifier and the up converter.

* * * * *